(12) United States Patent
Noh et al.

(10) Patent No.: US 12,349,606 B2
(45) Date of Patent: Jul. 1, 2025

(54) THREE-TERMINAL SYNAPTIC DEVICE

(71) Applicants: HYUNDAI MOTOR COMPANY, Seoul (KR); KIA CORPORATION, Seoul (KR); POSTECH Research and Business Development Foundation, Pohang-si (KR)

(72) Inventors: Su-Jung Noh, Seoul (KR); Ji-Sung Lee, Suwon-si (KR); Han-Saem Lee, Seoul (KR); Joon-Hyun Kwon, Hwaseong-si (KR); Kyu-Min Lee, Gwangju (KR); Hyun-Sang Hwang, Daegu (KR); Woo-Seok Choi, Hanam-si (KR)

(73) Assignees: HYUNDAI MOTOR COMPANY, Seoul (KR); KIA CORPORATION, Seoul (KR); POSTECH Research and Business Development Foundation, Pohang-si (KR)

(*) Notice: Subject to any disclaimer, the term of this patent is extended or adjusted under 35 U.S.C. 154(b) by 461 days.

(21) Appl. No.: 17/827,234

(22) Filed: May 27, 2022

(65) Prior Publication Data
US 2023/0172080 A1 Jun. 1, 2023

(30) Foreign Application Priority Data

Nov. 26, 2021 (KR) .................. 10-2021-0165818

(51) Int. Cl.
*H10N 70/20* (2023.01)
(52) U.S. Cl.
CPC ......... *H10N 70/253* (2023.02); *H10N 70/245* (2023.02)

(58) Field of Classification Search
None
See application file for complete search history.

(56) References Cited

U.S. PATENT DOCUMENTS

| | | |
|---|---|---|
| 2019/0214081 A1 | 7/2019 | Li et al. |
| 2021/0020780 A1* | 1/2021 | Rozen ............... H01L 29/24 |
| 2021/0305504 A1* | 9/2021 | Bishop ............ H10N 70/826 |
| 2022/0271135 A1* | 8/2022 | Mizushima ........ H01L 29/7883 |
| 2022/0375994 A1* | 11/2022 | Lee ..................... G06N 3/063 |

OTHER PUBLICATIONS

Lee, Kyumin, et al. "Improved synaptic functionalities of Li-based nano-ionic synaptic transistor with ultralow conductance enabled by Al2O3 barrier layer." Nanotechnology 32.27 (2021): 275201 (1 page).

* cited by examiner

*Primary Examiner* — Michelle Mandala
(74) *Attorney, Agent, or Firm* — Lempia Summerfield Katz LLC

(57) ABSTRACT

A three-terminal synaptic device includes a substrate; a source electrode and a drain electrode which are provided on the substrate and spaced apart from each other. The three-terminal synaptic device further includes: a channel layer provided on the substrate, the source electrode, and the drain electrode; an ion reservoir layer which stores active ions; a gate electrode provided on the ion reservoir layer; and an ion barrier layer disposed between the ion reservoir layer. In particular, the channel layer controls movement of active ions between the ion reservoir layer and the channel layer. The three-terminal synaptic device inhibits rapid movement of ions.

6 Claims, 13 Drawing Sheets

THREE-TERMINAL SYNAPTIC DEVICE

CROSS-REFERENCE TO RELATED APPLICATION

This application claims priority to and the benefit of Korean Patent Application No. 10-2021-0165818, filed on Nov. 26, 2021, which is incorporated herein by reference in its entirety.

FIELD

The present disclosure relates to a synaptic device and a three-terminal synaptic device for a neuromorphic system.

BACKGROUND

A neuromorphic system is a system emulating the human brain and configured to process data and learn in a manner similar to the brain. For example, where one neuron device is connected to another neuron device through a synapse of the neuron device. When a neuron device outputs data, a synaptic device delivers the input data.

In a two-terminal synaptic device as depicted in FIG. 1 among such synaptic devices, a voltage for a writing operation and a voltage for a reading operation are applied in the same direction. The two-terminal synaptic device includes a simple structure and thus the process thereof is advantageously simple. However, since the writing operation and the reading operation are in the same direction, the reading operation includes an effect on the resistance state of the synapse, that disadvantageously disturbs the precise writing operation (i.e., read disturb).

In contrast, in the three-terminal synaptic device as depicted in FIG. 2, a voltage for a writing operation and a voltage for a reading operation are applied in different directions. In addition, more process operations are disadvantageously used compared to those of the two-terminal synaptic device. However, since the writing operation is in a different direction from the reading operation, there is advantageously no read disturb.

Furthermore, a two-terminal synaptic device in the related art includes a barrier interposed between electrolyte and an electrode to inhibit a reaction between Li ions and the electrode, thereby improving a switching velocity. In the related art of two-terminal and three-terminal synaptic devices including the two-terminal synaptic device, we have discovered that it is desired to inhibit the movement of ions between the electrolyte and the electrode. However, we have found that there have been limitations in the improvement of linearity and non-volatility that are requirements for a synaptic device. Thus, the rate of recognition of the neuromorphic system should be reduced, which is problematic.

The above information disclosed in this Background section is only for enhancement of understanding of the background of the disclosure and accordingly it may include information that does not include prior art that is already known to a person of ordinary skill in the art.

SUMMARY

The present disclosure provides a three-terminal synaptic device configured to inhibit rapid movement of ions. The characteristics of the three-terminal synaptic device as a synaptic device are improved.

In one aspect of the present disclosure, a three-terminal synaptic device includes: a substrate, a source electrode and a drain electrode provided on the substrate and spaced apart from each other, a channel layer provided on the substrate, the source electrode, and the drain electrode, an ion reservoir layer storing active ions therein, a gate electrode provided on the ion reservoir layer, and an ion barrier layer disposed between the ion reservoir layer and the channel layer to control movement of active ions between the ion reservoir layer and the channel layer.

In addition, the three-terminal synaptic device may further include an electrolyte layer provided between the ion reservoir layer and the ion barrier layer.

The ion barrier layer may be formed of a two-dimensional material. The ion barrier layer may be formed of graphene or tungsten disulfide.

Alternatively, the ion barrier layer may be formed of a metal oxide. In addition, the ion barrier layer may be formed of an aluminum oxide ($Al_2O_3$).

In addition, the three-terminal synaptic device may have a conductance value of about tens of nS.

In the three-terminal synaptic device according to the present disclosure, the barrier layer is adjacent to the channel layer, and an electrode material is separated from the barrier layer. Thus, the injection and removal of ions into and from the channel are properly adjusted.

The barrier layer may have an effect on the reduction of ion diffusivity and improve linearity and non-volatility, thereby improving the accuracy of recognition in the neuromorphic system.

BRIEF DESCRIPTION OF THE DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The present disclosure, operational advantages of the present disclosure, and objects realized by implementation of the present disclosure may be fully understood from the following detailed description of embodiments of the present disclosure, taken in conjunction of the accompanying drawings.

In the description of embodiments of the present disclosure, either a detailed or repetitive description of known functions may be omitted when the subject matter of the present disclosure may be rendered unclear thereby.

When a component, device, element, or the like of the present disclosure is described as having a purpose or performing an operation, function, or the like, the component, device, or element should be considered herein as being "configured to" meet that purpose or to perform that operation or function.

Figure 1:
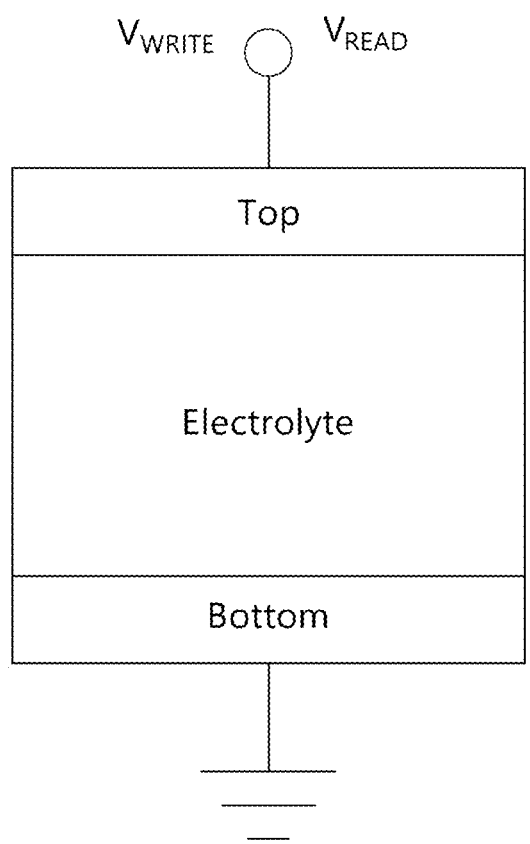
FIG. 1 is a diagram depicting an example of a two-terminal synaptic device of the related art.
Figure 2:
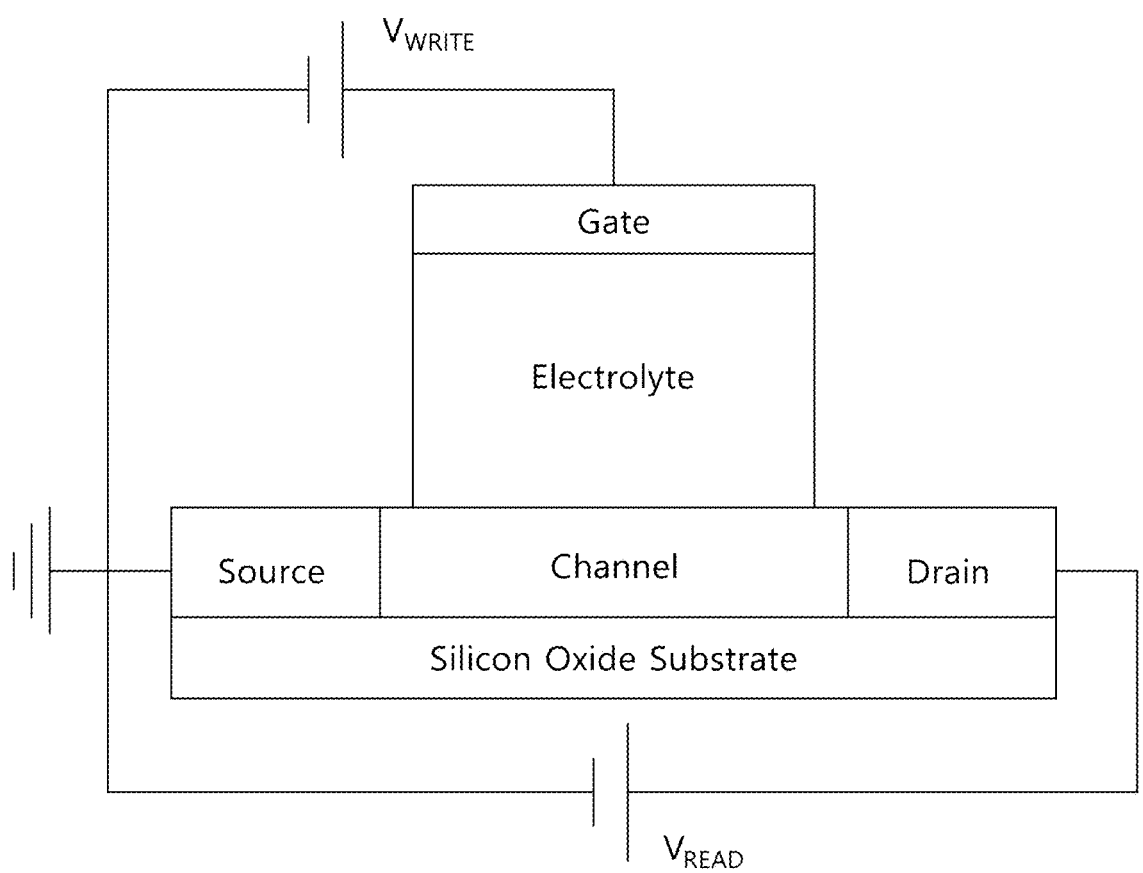
FIG. 2 depicts an example of a three-terminal synaptic device of the related art.
Figure 3:
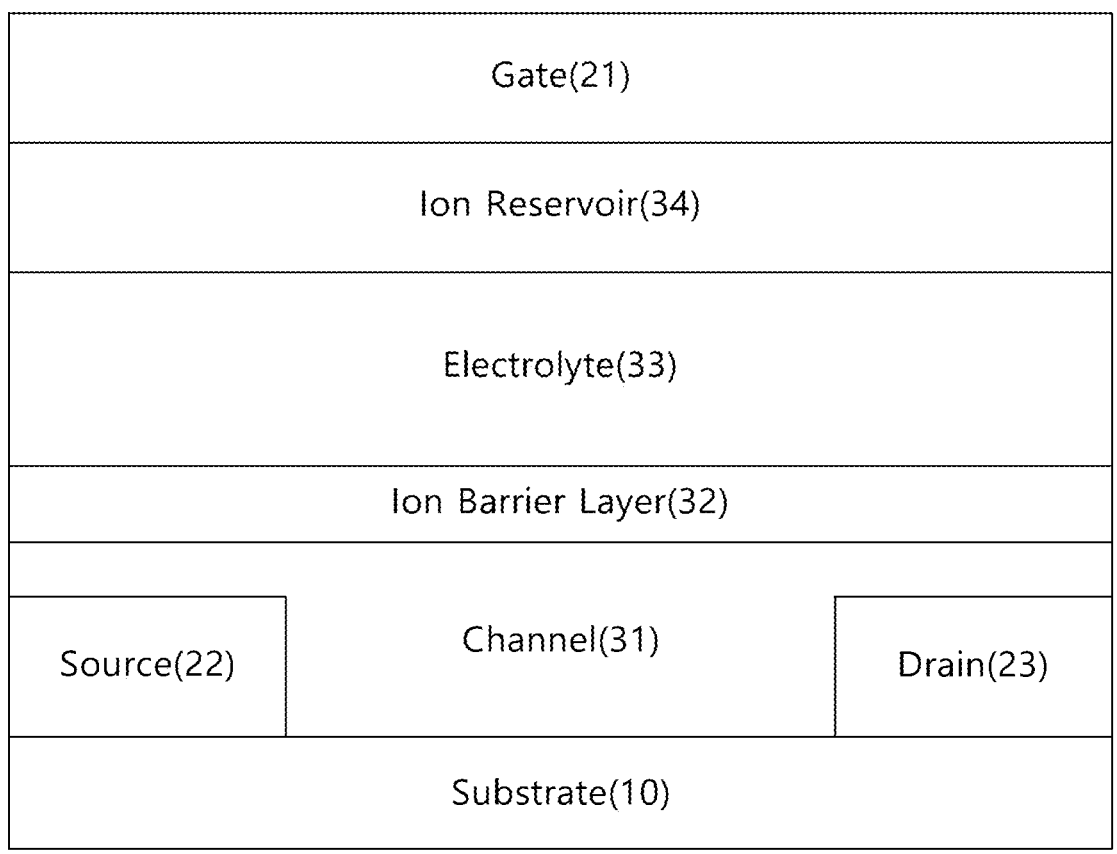
FIG. 3 is a diagram schematically depicting a three-terminal synaptic device according to an embodiment.

FIG. 3 is a diagram schematically depicting a three-terminal synaptic device according to an embodiment. Hereinafter, the three-terminal synaptic device according to an embodiment is described with reference to FIG. 3.

The present disclosure relates to a three-terminal synaptic device for a neuromorphic system, the three-terminal synaptic device configured to improve the characteristics thereof as a synaptic device by reducing rapid movement of ions.

The three-terminal synaptic device includes electrodes providing voltage signals and non-conductive layers in which ions move. The three-terminal synaptic device includes a substrate 10; a gate electrode 21, a source electrode 22, and a drain electrode 23 serving as electrodes; and a channel layer 31, an ion barrier layer 32, an electrolyte layer 33, and an ion reservoir layer 34 serving as the non-conductive layers.

The substrate 10 may be a silicon substrate or the like. The channel layer 31 is formed on the substrate 10. The channel layer 31 is formed of an organic semiconductor, an oxide semiconductor, a metal material, or the like, and the conductance of the channel layer 31 is changed by active ions.

The source electrode 22 and the drain electrode 23 are formed on the substrate 10 to be spaced apart from each other, with the channel layer 31 interposed between the source electrode 22 and the drain electrode 23. The channel layer 31 covers the source electrode 22 and the drain electrode 23 so as not to be in contact with the top layer.

The electrode may be formed of a metal material or a conductive polymer material.

The gate electrode 21 is formed on top of the device, and the ion barrier layer 32, the electrolyte layer 33, and the ion reservoir layer 34 are sequentially stacked between the gate electrode 21 and the channel layer 31.

Active ions are stored in the ion reservoir layer 34. Due to the electrolyte layer 33 between the ion reservoir layer 34 and the channel layer 31, active ions may move to the channel layer 31 or active ions that have moved to the channel layer 31 may move back to the ion reservoir layer 34.

Since the ion reservoir layer 34 contains an ionic material, the ion reservoir layer 34 includes synaptic characteristics. That is, when a voltage is applied to the gate electrode 21, the applied voltage moves active ions from the ion reservoir layer 34 to the channel layer 31. The moved active ions change the amount of active ions in the channel layer 31, thereby changing the conductivity of the channel layer 31. In addition, when the applied voltage is reversed, active ions move back to the ion reservoir layer 34.

In an embodiment, the ion barrier layer 32 is formed between the electrolyte layer 33 and the channel layer 31 to inhibit the movement of ions without application of a voltage, thereby improving the retention and linearity of a synaptic device.

Figure 4:
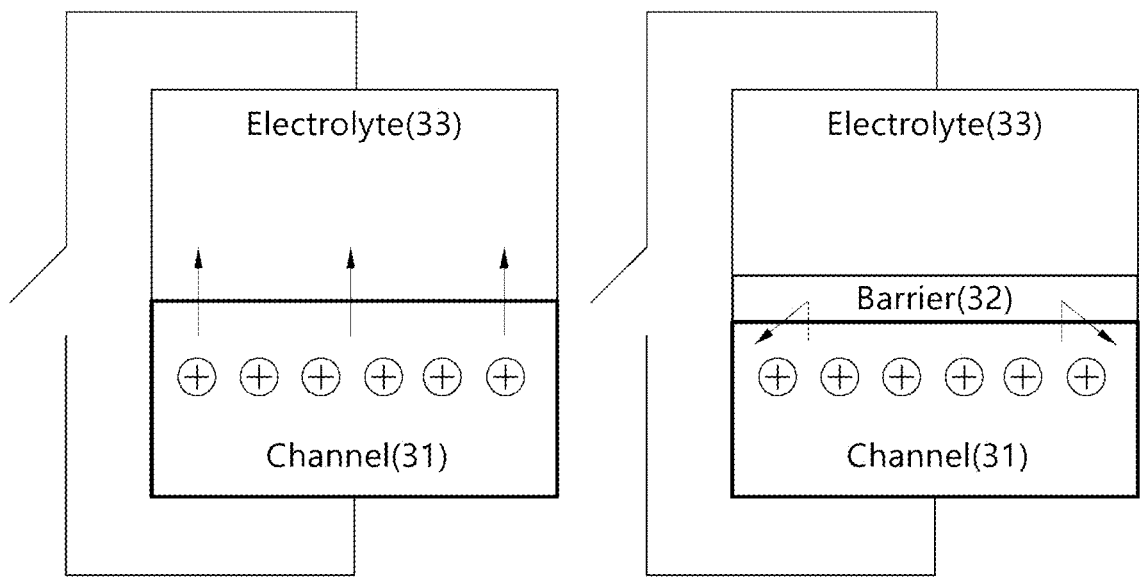
FIG. 4 is a diagram depicting a reason for the difference of retention according to whether or not a barrier layer is present according to an embodiment.
Figure 5:
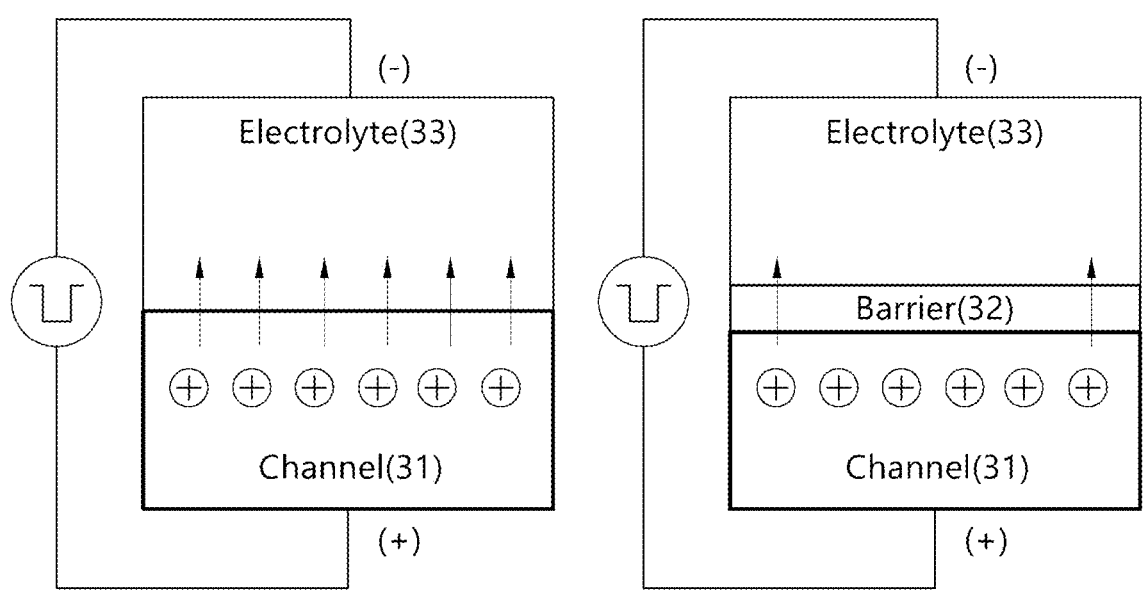
FIG. 5 is a diagram depicting a reason for the difference of linearity according to whether or not a barrier layer is present according to an embodiment.

FIG. 4 is a diagram depicting a reason for the difference of retention according to whether or not a barrier layer is present. FIG. 5 is a diagram depicting a reason for the difference of linearity according to whether or not a barrier layer is present.

In the left part of FIG. 4, when there is no barrier layer, ions may disperse to the electrolyte layer, and the retention may be reduced. In contrast, in the right part of FIG. 4, when there is the barrier layer 32, the diffusion may be inhibited, thereby improving the retention.

In addition, in the left part of FIG. 5, when there is no barrier layer, an excessive amount of ions may move when voltage pulses are applied, thereby resulting abnormal linearity. In contrast, in the right part of FIG. 5, when there is the barrier layer, the movement of an excessive amount of ions may be inhibited and a uniform amount of ions may move, thereby resulting in ideal linearity.

According to the following Equation 1 (i.e., Nernst-Plank Equation) expressing the movement of ions within a medium, the movement of ions is divided into the diffusion of ions due to a concentration difference $\nabla C_{Li+}$ referred to as the first term and the movement of ions due to a voltage difference $\nabla \Phi$ referred to as the second term.

The first term relates to retention, and the second term relates to the linearity of changes in synaptic weight.

Both the two terms are proportional to the diffusivity $D_{Li+}$ of ions. As the diffusivity decreases, unnecessary movement of ions is inhibited, so that improvements in retention and linearity are expected.

Thus, the barrier layer may reduce the diffusivity, thereby improving both retention and linearity.

$$J_{Li+} = (-D_{Li+} \nabla C_{Li+}) + \left(-\frac{z_{Li+}F}{RT} D_{Li+} C_{Li+} \nabla \Phi\right) \qquad \text{[Equation 1]}$$

As described above, according to the present disclosure, the three-terminal synaptic device includes the ion barrier layer capable of controlling the movement of active ions between the ion reservoir layer and the channel layer. In this regard, the ion barrier layer is formed of an oxide capable blocking improper ion movement while allowing ions to pass therethrough. Consequently, not only the retention but also the linearity of the three-terminal synaptic device may be improved.

The ion barrier layer 32 may be formed of a two-dimensional (2D) material of graphene and tungsten disulfide ($WS_2$), and for example, a metal oxide such as aluminum oxide ($Al_2O_3$).

The 2D material is a material of a single atomic layer including a 2D arrangement of atoms.

Additional improvements in a case in which the ion barrier layer 32 is formed of a metal oxide are hereinafter described.

Figure 6:
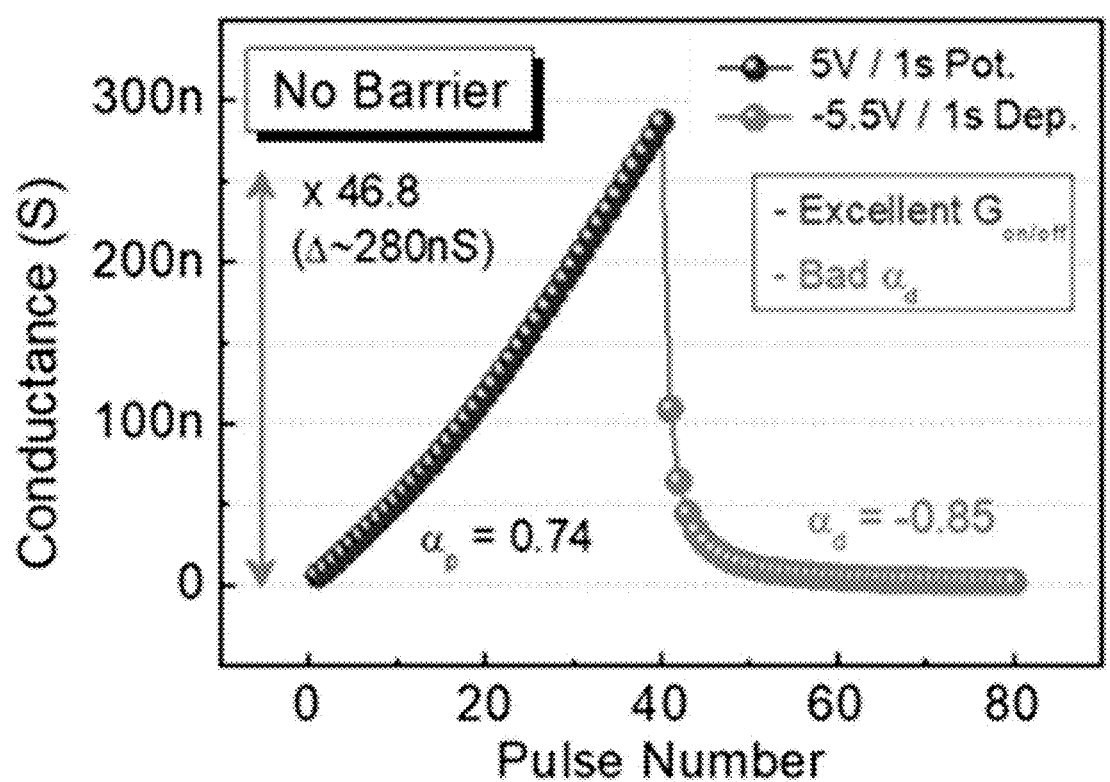
FIGS. 6 and 7 are graphs comparing conductances when the barrier layer is formed of $Al_2O_3$ according to an embodiment.
Figure 7:
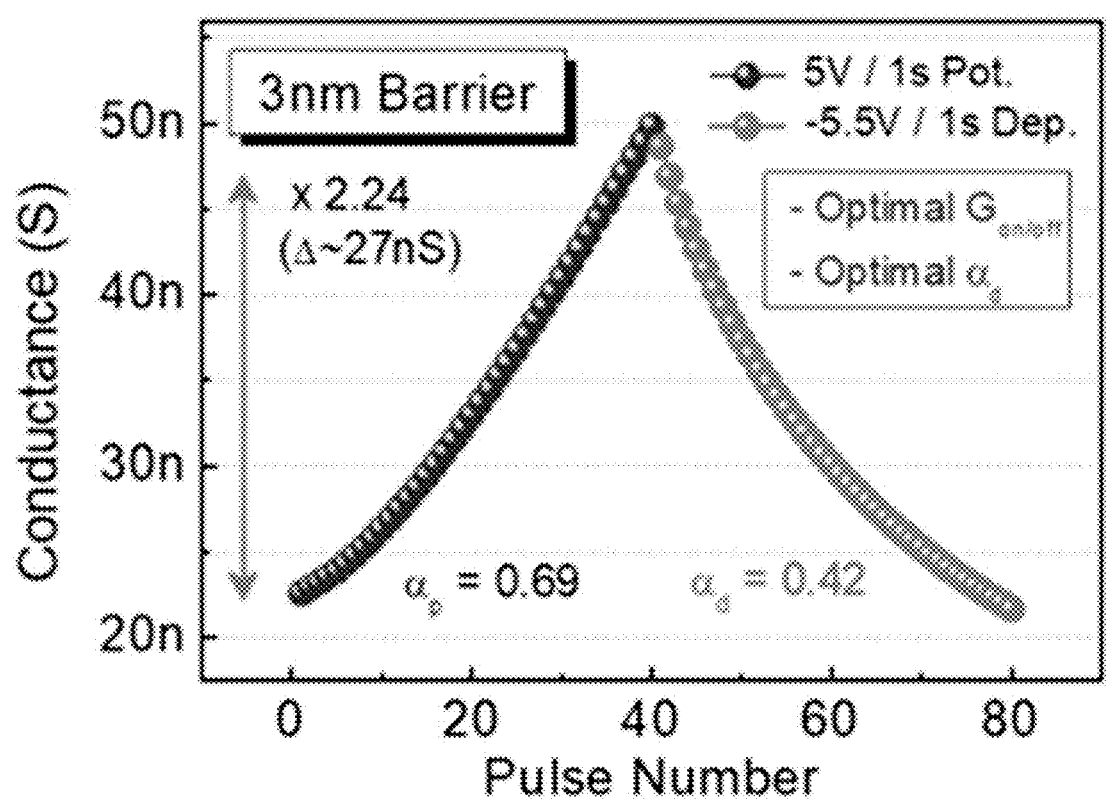

FIGS. 6 and 7 depict graphs comparing conductances when the barrier layer is formed of $Al_2O_3$. Here, FIG. 6 depicts a case with no barrier layer, and FIG. 7 depicts a case in which the barrier layer is formed of $Al_2O_3$.

In FIGS. 6 and 7, the electrolyte layer is formed of 100 nm $Li_3PO_4$, and the channel layer is formed of 50 nm $WO_x$.

Figure 8:
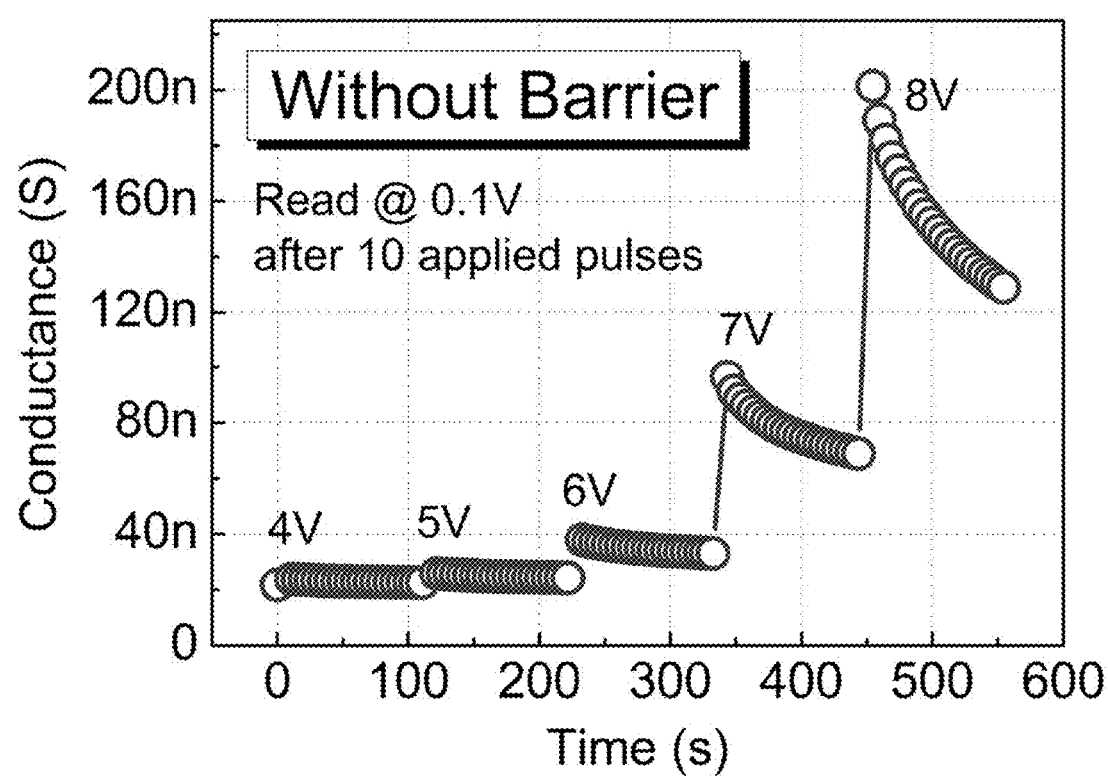
FIGS. 8 and 9 depict the difference of retention according to whether or not a barrier layer is present when the barrier layer is formed of $Al_2O_3$ according to an embodiment.
Figure 9:
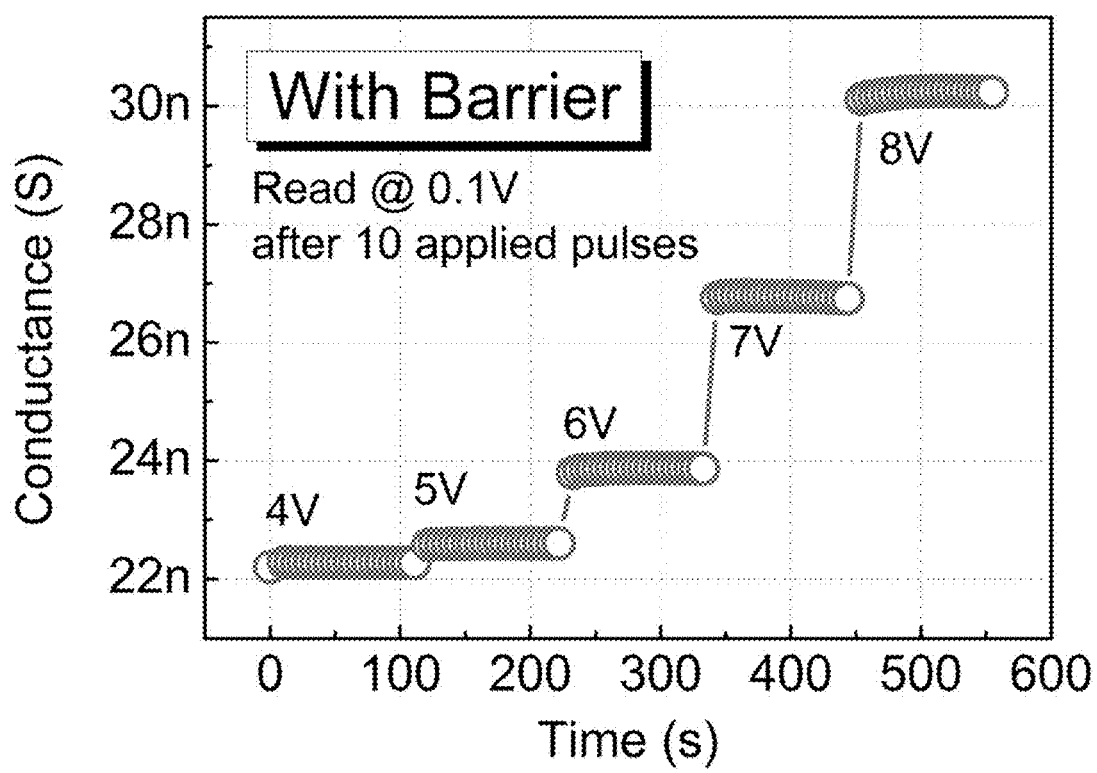

In addition, FIGS. 8 and 9 depict the difference of retention according to whether or not a barrier layer is present when barrier layers are formed of $Al_2O_3$.

By comparing changes in the weight of synapses in FIGS. 6 and 7, the linearity was abnormal when there is no barrier layer (FIG. 6) and the linearity was ideally improved when there is the barrier layer (FIG. 7).

In addition, by comparing the retention according to whether or not the barrier layer is present in FIGS. 8 and 9, a volatile characteristic was provided when there was no barrier layer (FIG. 8) and a non-volatile characteristic was provided after the interposition of the barrier layer and thus the retention was improved (FIG. 9).

The above-described results may be arranged as follows.

TABLE 1

|  | 2D Material | Metal Oxide |
| --- | --- | --- |
| Linearity | Improve | Improve |
| Retention | Improve | Improve |
| G Level (Energy) | ~µS (High Energy) | ~nS (Low Energy) |

The linearity is improved in both the 2D and the metal oxide.

$D_{ion}$ may be reviewed by cyclic voltammetry analysis (Dion to d(Peak Current)/d(Sweep Rate 1/2)).

Figure 10:
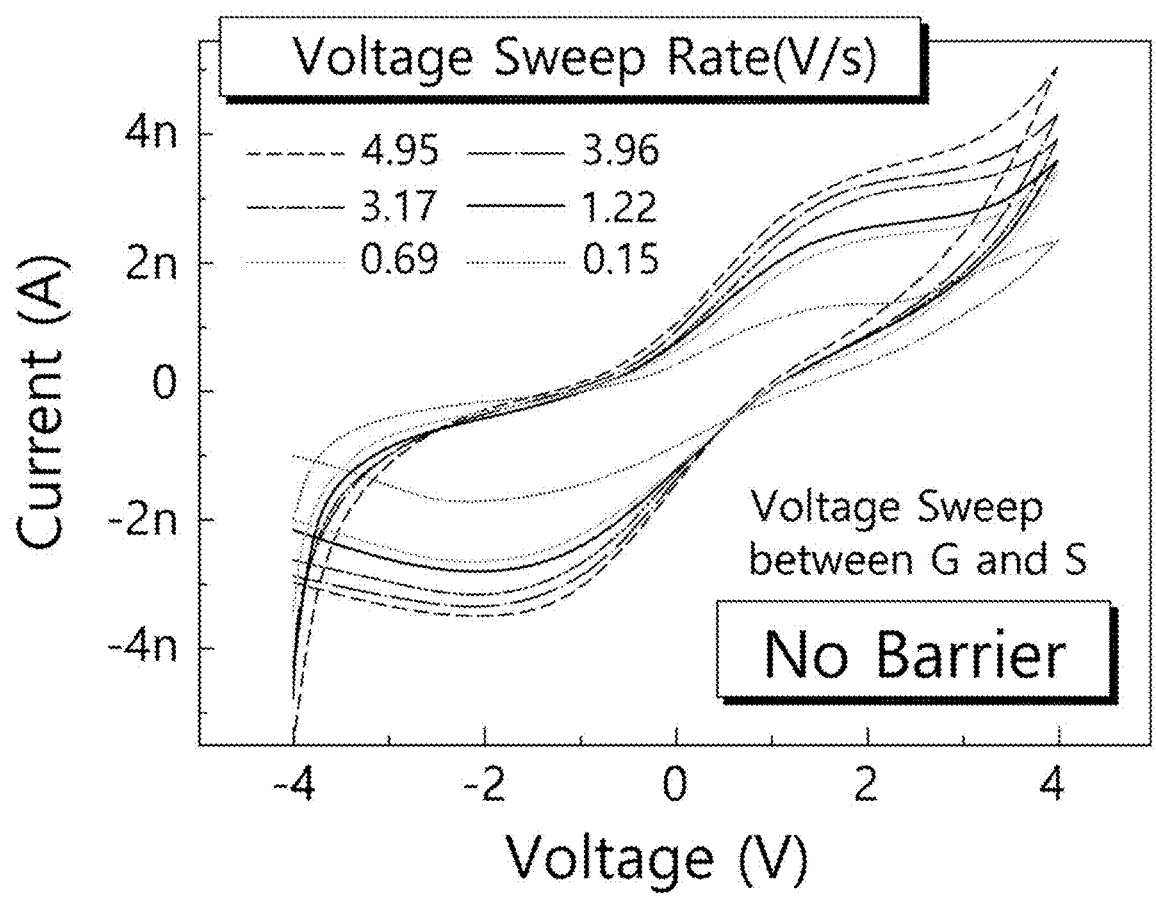
FIGS. 10 and 11 compare the results of cyclic voltammetry analysis when the barrier layer is formed of $Al_2O_3$ according to an embodiment.
Figure 11:
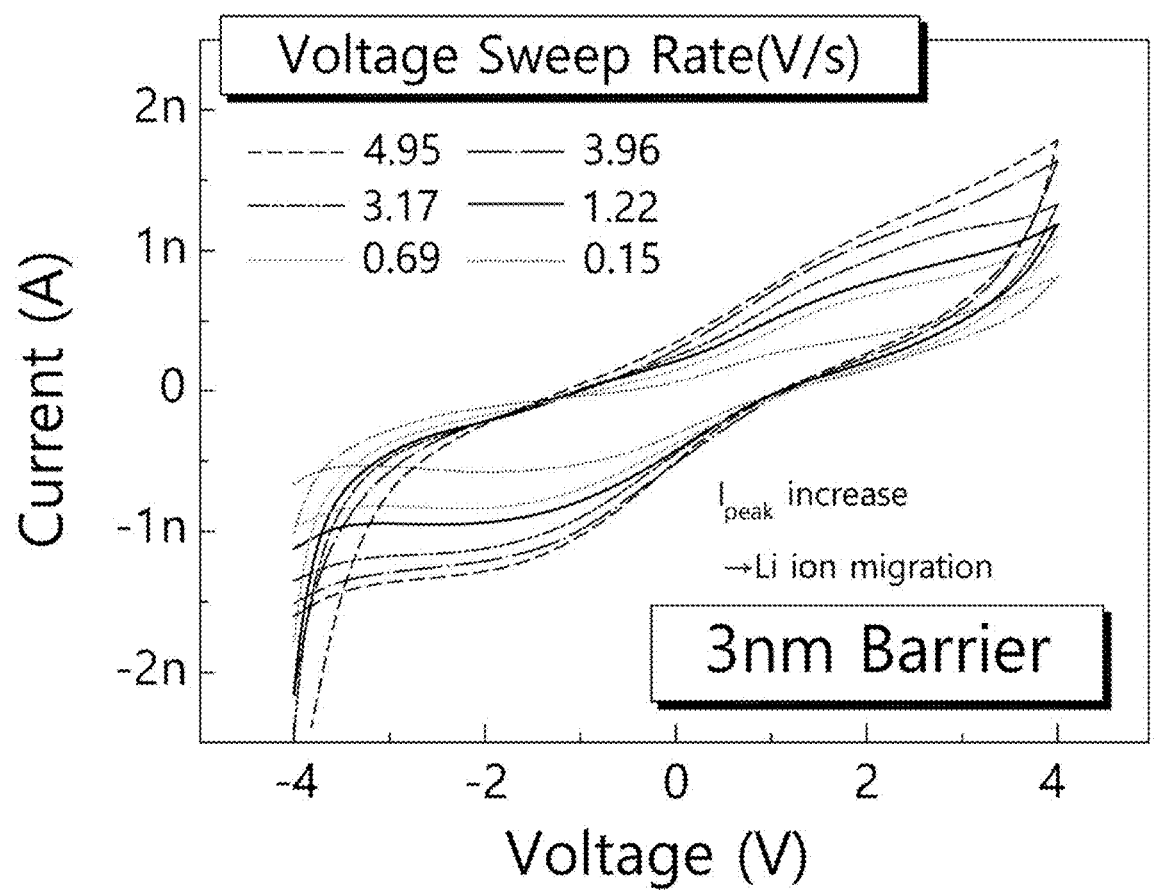

FIGS. 10 and 11 depict a comparison of the results of cyclic voltammetry analysis when the barrier layer is formed of $Al_2O_3$.

The cyclic voltammetry analysis is an analysis method of measuring a current through a cycle of voltages ($-V \rightarrow +V \rightarrow -V$). Current picks are measured. As the change rate of the voltage increases, the heights of the picks are also increased. The square root of the change rate of the voltage includes a linear relation with the current pick, in which the inclination is proportional to the diffusivity of ions.

$D_{ion}$ is reduced in the case of the $Al_2O_3$ oxide film of FIG. 11 compared to the case of FIG. 10 in which no barrier layer is provided.

Figure 12:
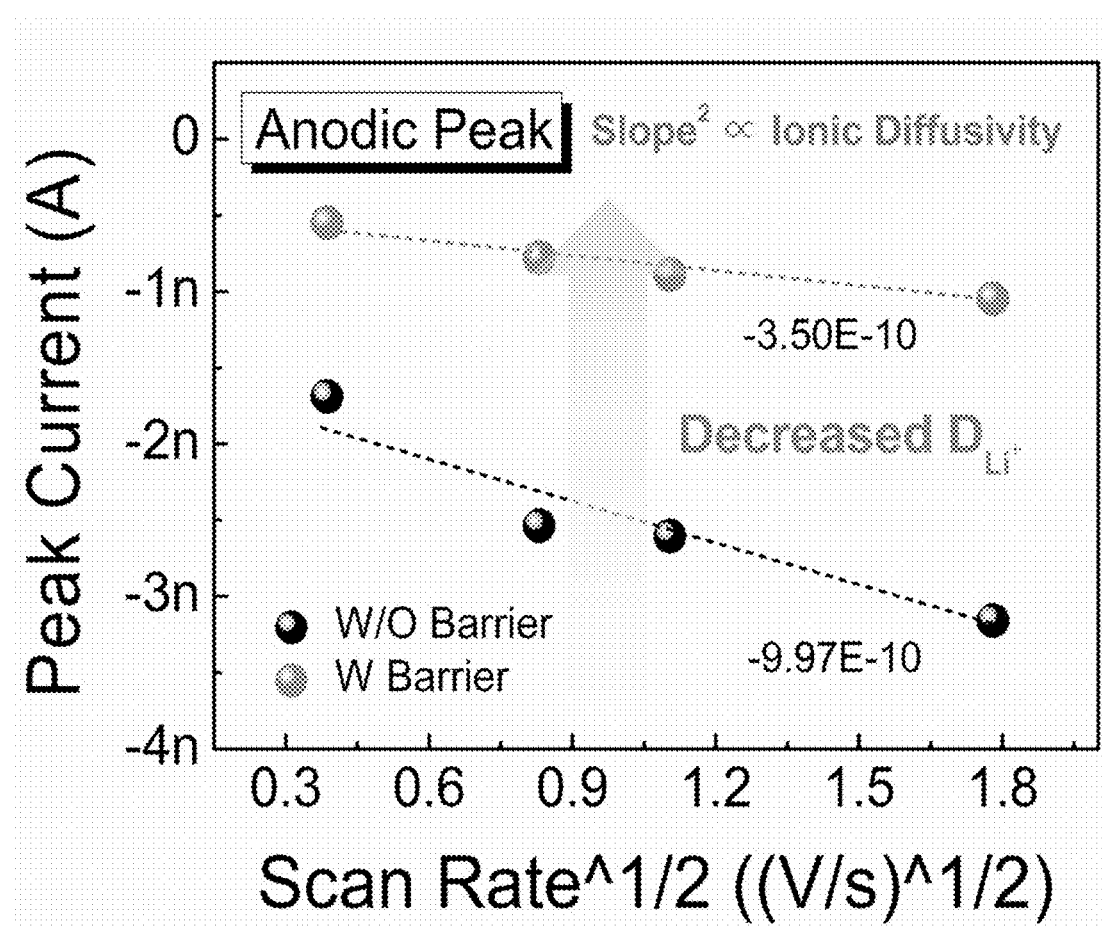
FIG. 12 is a graph comparing ion diffusivities according to whether or not the barrier layer is present when the barrier layer is formed of $Al_2O_3$ according to an embodiment.

FIG. 12 depicts a graph comparing ion diffusivities according to whether or not the barrier layer is present when the barrier layer is formed of $Al_2O_3$. The inclination decreases due to the presence of the barrier layer and as such, the barrier layer includes an effect on the reduction of ion diffusivity.

A conductance level on the order of µS is provided due to high electrical conductivity of the 2D material, and a conductance level on the order of nS is enabled due to low electrical conductivity of the oxide. Thus, a low energy operation is enabled.

Figure 13:
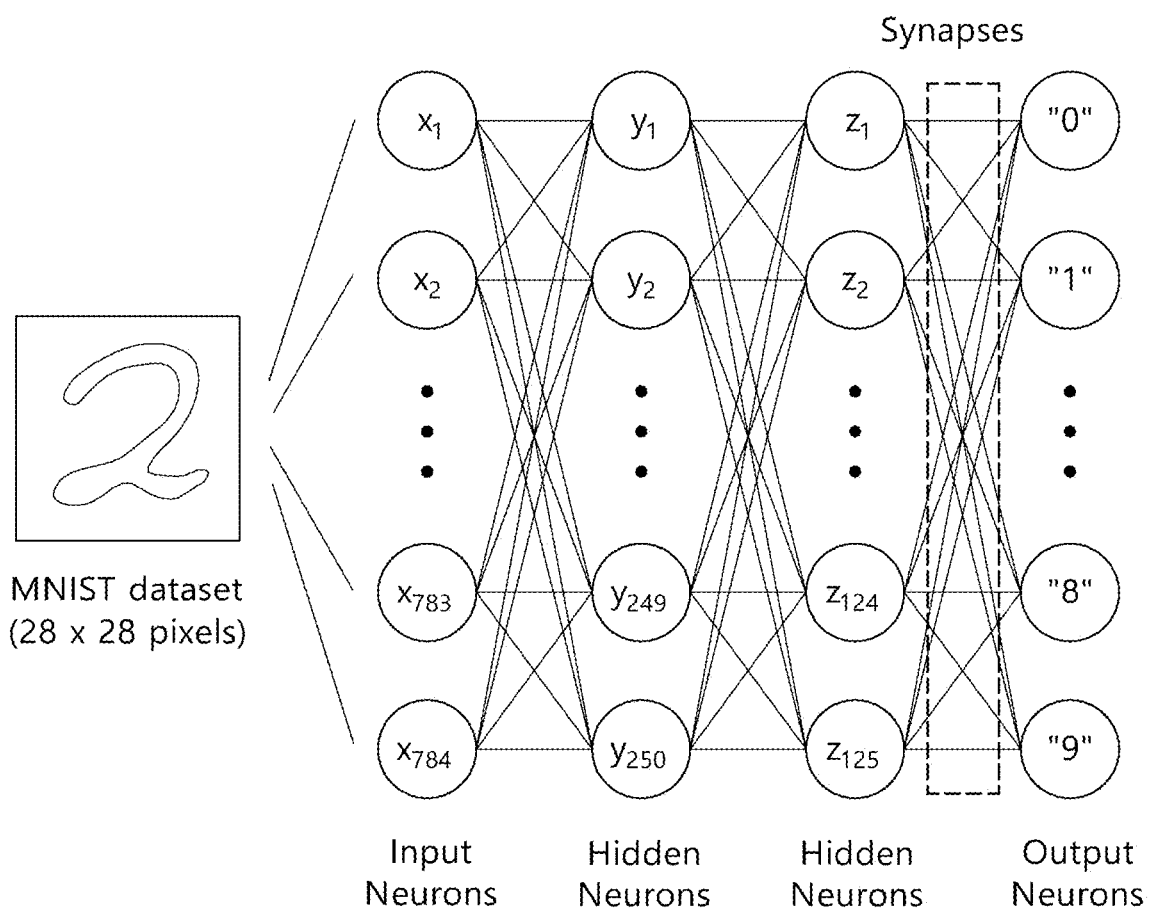
FIG. 13 depicts an example in which a specific image is input to a neural network according to an embodiment.
Figure 14:
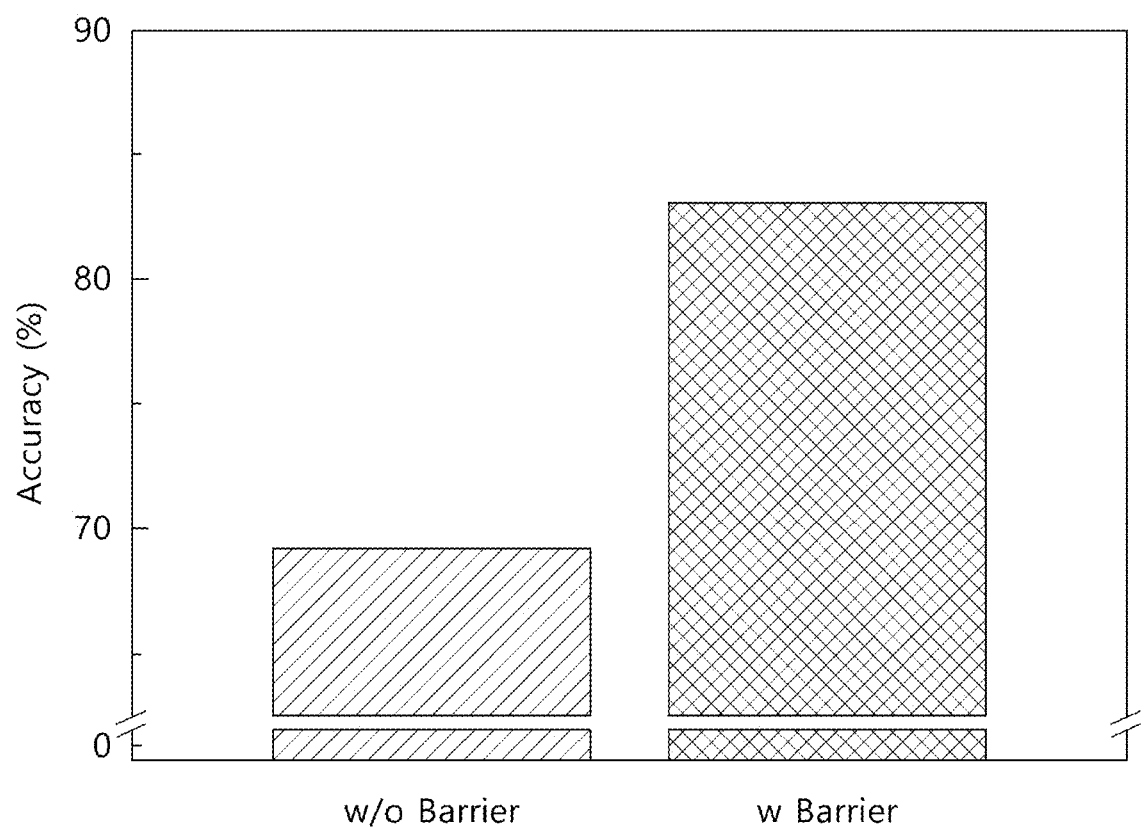
FIG. 14 depicts the difference of the accuracy of recognition of the example of FIG. 13 according to whether the barrier layer is present according to an embodiment.

FIG. 13 depicts an example in which a specific image is input to a neural network. FIG. 14 depicts the difference of the accuracy of recognition of the example of FIG. 13 according to whether the barrier layer is present.

As depicted in FIGS. 13 and 14, when an MNIST handwriting image is input to neural network hardware as depicted in FIG. 13, the accuracy of recognition may vary as depicted in FIG. 14 according to whether the 3-terminal synapse includes the barrier layer. The accuracy of pattern recognition is improved as the synaptic characteristics are improved according to the presence of the barrier layer.

Although the present disclosure is described with reference to the accompanying drawings as set forth above, the present disclosure is not limited thereto. Those having ordinary skill in the art may appreciate that a variety of changes and modifications are possible without departing from the principle and scope of the present disclosure. Therefore, it should be understood that such changes or modifications belong to the scope of the present disclosure.

The invention claimed is:

1. A three-terminal synaptic device comprising:
a substrate;
a source electrode and a drain electrode provided on the substrate and spaced apart from each other;
a channel layer provided on the substrate, the source electrode, and the drain electrode;
an ion reservoir layer configured to store active ions;
a gate electrode provided on the ion reservoir layer;
an ion barrier layer disposed between the ion reservoir layer and the channel layer, the ion barrier configured to control movement of active ions between the ion reservoir layer and the channel layer; and
an electrolyte layer provided between the ion reservoir layer and the ion barrier layer.

2. The three-terminal synaptic device of claim 1, wherein the ion barrier layer comprises a two-dimensional material.

3. The three-terminal synaptic device of claim 2, wherein the ion barrier layer comprises graphene or tungsten disulfide.

4. The three-terminal synaptic device of claim 1, wherein the ion barrier layer comprises a metal oxide.

5. The three-terminal synaptic device of claim 4, wherein the ion barrier layer comprises aluminum oxide ($Al_2O_3$).

6. The three-terminal synaptic device of claim 5, wherein the three-terminal synaptic device includes a conductance value of tens of nano siemens.

* * * * *